US012604500B2

(12) United States Patent
Son et al.

(10) Patent No.: US 12,604,500 B2
(45) Date of Patent: Apr. 14, 2026

(54) N-TYPE 2D TRANSITION METAL DICHALCOGENIDE (TMD) TRANSISTOR

(71) Applicant: HRL Laboratories, LLC, Malibu, CA (US)

(72) Inventors: Kyung-Ah Son, Moorpark, CA (US); Jeong-Sun Moon, Moorpark, CA (US); Hwa Chang Seo, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 583 days.

(21) Appl. No.: 17/969,232

(22) Filed: Oct. 19, 2022

(65) Prior Publication Data

US 2024/0136429 A1 Apr. 25, 2024
US 2024/0234556 A9 Jul. 11, 2024

(51) Int. Cl.
| | |
|---|---|
| *H10D 48/36* | (2025.01) |
| *H01L 21/02* | (2006.01) |
| *H10D 30/67* | (2025.01) |
| *H10D 62/80* | (2025.01) |
| *H10D 64/62* | (2025.01) |
| *H10D 99/00* | (2025.01) |

(52) U.S. Cl.
CPC ..... *H10D 48/362* (2025.01); *H01L 21/02381* (2013.01); *H01L 21/02387* (2013.01); *H01L 21/024* (2013.01); *H01L 21/02568* (2013.01); *H10D 30/6739* (2025.01); *H10D 62/80* (2025.01); *H10D 64/62* (2025.01); *H10D 99/00* (2025.01)

(58) Field of Classification Search
CPC .. H10D 48/362; H10D 30/6739; H10D 62/80; H10D 64/62; H10D 99/00; H10D 30/47;

H10D 30/675; H10D 30/6757; H01L 21/02381; H01L 21/02387; H01L 21/024; H01L 21/02568; H01L 21/02488; H01L 21/02576; H01L 21/0259
USPC ......................................................... 257/29
See application file for complete search history.

(56) References Cited

U.S. PATENT DOCUMENTS

| | | | |
|---|---|---|---|
| 8,916,914 B2 | 12/2014 | Kim et al. | |
| 9,608,101 B2 | 3/2017 | Kis et al. | |
| 10,446,694 B2 | 10/2019 | Li et al. | |
| (Continued) | | | |

OTHER PUBLICATIONS

Y. Chen; "Growth of a Large, Single-Crystalline WS2 Monolayer for High-Performance Photodetectors by Chemical Vapor Deposition", Micromachines 2021, 12, 137; https://doi.org/10.3390/mi12020137; Jan. 27, 2021; pp. 1-7.

(Continued)

*Primary Examiner* — Duy T Nguyen
*Assistant Examiner* — Pratiksha Jayant Lohakare
(74) *Attorney, Agent, or Firm* — Wheatstone IP Law Corporation; Milad G. Shara

(57) ABSTRACT

A transition metal dichalcogenide (TMD) transistor includes a substrate, an n-type two-dimensional (2D) TMD layer, a metal source electrode, a metal drain electrode, and a gate dielectric. The substrate has a top portion that is an insulating layer, and the n-type 2D TMD layer is on the insulating layer. The metal source electrode, the metal drain electrode, and the gate dielectric are on the n-type 2D TMD layer. The metal gate electrode is on top of the gate dielectric and is between the metal source electrode and the metal drain electrode.

17 Claims, 8 Drawing Sheets

(56)         References Cited

U.S. PATENT DOCUMENTS

| | | | | |
|---|---|---|---|---|
| 2014/0264280 | A1* | 9/2014 | Kim | H10D 30/6735 |
| | | | | 257/29 |
| 2016/0020352 | A1* | 1/2016 | Konstantatos | H10F 30/21 |
| | | | | 438/94 |
| 2016/0148959 | A1* | 5/2016 | Cheng | H10F 77/122 |
| | | | | 438/59 |
| 2018/0145184 | A1* | 5/2018 | Clifton | H10D 30/6219 |
| 2018/0151751 | A1* | 5/2018 | Yeh | H10D 99/00 |
| 2018/0358474 | A1* | 12/2018 | Li | H10D 99/00 |
| 2020/0098875 | A1* | 3/2020 | Sung | H10B 12/05 |
| 2020/0098880 | A1* | 3/2020 | Sharma | H10D 64/62 |
| 2020/0098932 | A1* | 3/2020 | Lajoie | H10D 30/6746 |
| 2020/0176582 | A1* | 6/2020 | Rode | H10D 30/43 |
| 2021/0408288 | A1* | 12/2021 | O'Brien | H10D 64/015 |

OTHER PUBLICATIONS

L. Yu et al.; "Enhancement-Mode Single-layer CVD MoS2 FET Technology for Digital Electronics", 2015 IEEE International Electron Devices Meeting (IEDM); Washington, D.C.; Dec. 7, 2015; pp. 1-4.

A. Kumar et al.; "Doped WS2 Transistors with Large on-off Ratio and High on-Current", IEEE, 2020 Device Research Conference (DRC), Columbus, OH; Jun. 21, 2020; pp. 1-2.

* cited by examiner

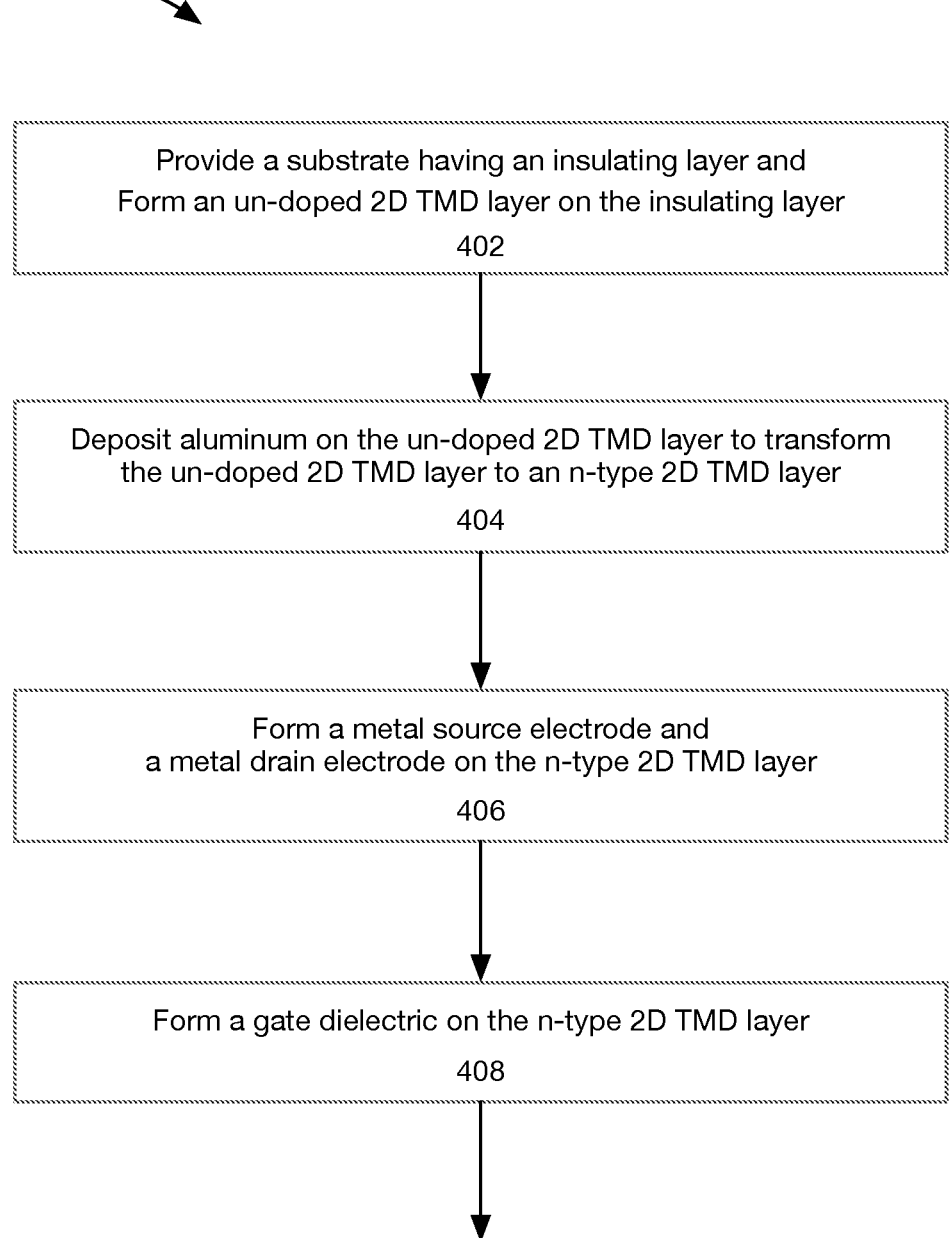

400

Provide a substrate having an insulating layer and
Form an un-doped 2D TMD layer on the insulating layer

402

Deposit aluminum on the un-doped 2D TMD layer to transform
the un-doped 2D TMD layer to an n-type 2D TMD layer

404

Form a metal source electrode and
a metal drain electrode on the n-type 2D TMD layer

406

Form a gate dielectric on the n-type 2D TMD layer

408

Form a metal gate electrode on the gate dielectric and between
the metal source electrode and the metal drain electrode

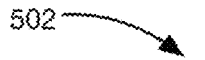
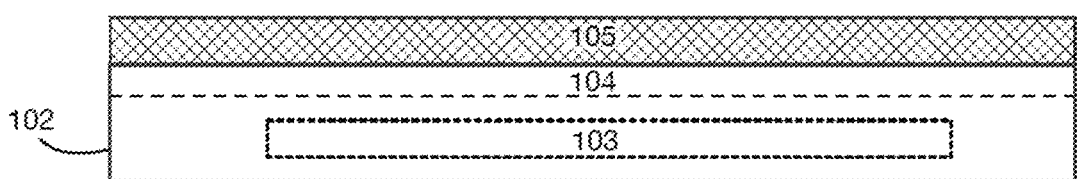
FIG. 5A
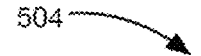
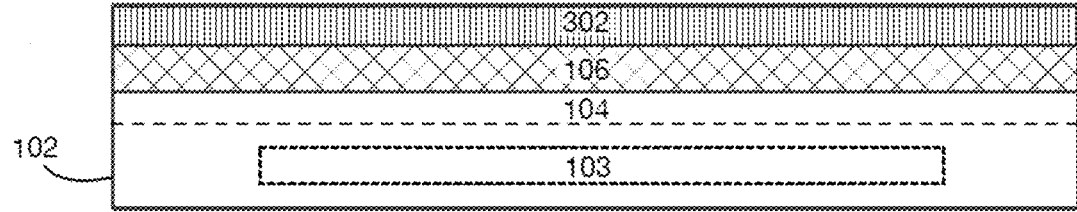
FIG. 5B

N-TYPE 2D TRANSITION METAL DICHALCOGENIDE (TMD) TRANSISTOR

STATEMENT REGARDING FEDERAL FUNDING

This invention was made under U.S. Government contract N000394659. The U.S. Government has certain rights in this invention.

TECHNICAL FIELD

The present application relates generally to semiconductor devices, and particularly to transition metal dichalcogenide (TMD) transistors and their methods of fabrication.

BACKGROUND

Two-dimensional (2D) transition metal dichalcogenide (TMD) materials are advantageous for transistor applications due to their high carrier mobilities, medium-to-high bandgap, and 2D geometry which support high on-state currents and low off-state currents. The term "2D" applies to cases where bonding and electrical conduction is in a 2D plane parallel to a layer of the TMD material and where bonding and electrical conduction are poor in a direction perpendicular to the plane of the layer.

Despite the advantages of TMD as a semiconducting material, most microelectronics are based on silicon and silicon germanium, and to a lesser extent on III-V and II-VI materials. For microelectronics based on silicon and silicon germanium, individual electrical devices may be connected together to form circuits that perform, for example, complementary metal oxide semiconductor (CMOS) logic and memory functions. These functions require metal lines to wire the individual transistors into the required circuits, and these lines are fabricated as part of a Back End Of Line (BEOL) process. In the BEOL, one or more layers of patterned metal lines are routed to provide power and signals to and from the individual electrical devices on the chip. Electrically insulating materials are also used in the BEOL to insulate the metal lines where needed. BEOL materials, however, may not be compatible with high temperature processing and typically require temperatures at or below about 500° C.

The fabrication of 2D TMD transistors have constraints for satisfying TMD doping and source/drain-to-TMD contact resistance requirements while also being capable of integrating with non-TMD semiconductor materials such as silicon and silicon germanium that are used in most microelectronic devices.

DESCRIPTION OF DRAWINGS

FIG. 4 illustrates a method of forming a TMD transistor according to one embodiment.

FIGS. 5A to 5H illustrate cross-sectional views from intermediate stages corresponding to the method of FIG. 4 for fabricating a TMD transistor, according to one embodiment.

DETAILED DESCRIPTION

Figure 1:
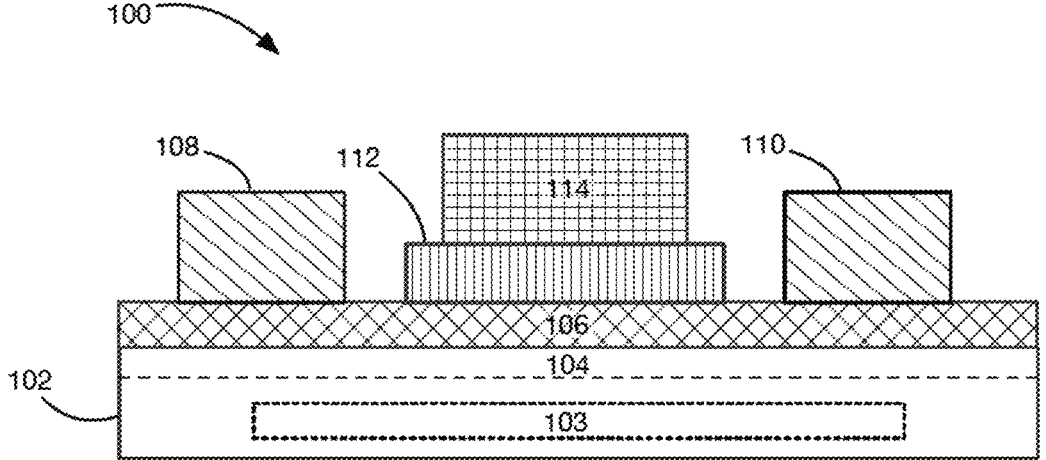
FIG. 1 illustrates a cross-sectional diagram of a TMD transistor according to one embodiment.

FIG. 1 illustrates a cross-sectional diagram of a transition metal dichalcogenide (TMD) transistor 100 according to one embodiment. The TMD transistor 100 includes a substrate 102 having an insulating layer 104 as a top portion of the substrate, an n-type two-dimensional (2D) TMD layer 106, a metal source electrode 108, a metal drain electrode 110, a gate dielectric 112, and a metal gate electrode 114. The n-type 2D TMD layer 106 is on the insulating layer 104 of the substrate 102. The metal source electrode 106, the metal drain electrode 108, and the gate dielectric 112 are on the n-type 2D TMD layer 106. The metal gate electrode 114 is on the gate dielectric 112, and between the metal source electrode 108 and the metal drain electrode 110.

The substrate 102 may comprise a semiconductor material such as silicon, silicon germanium, III-V and/or II-VI materials. For example, electrical devices 103 such as resistors, capacitors, inductors, diodes, and transistors may be fabricated in or on the semiconductor material within the substrate 102. The substrate 102 may include BEOL metal lines above such electrical devices 103 to provide power and/or signals to the device(s), electrically connect the devices into a circuit, and send power and/or signals to other circuit elements. Electrically conductive lines may be used to connect one or more electrodes of the TMD transistor 100 to the BEOL metal lines to access the electrical devices 103 or circuit within substrate 102. Accordingly, a composite circuit may be formed from combining the TMD transistor 100 with integrated circuits located within the substrate 102.

The insulating layer 104 of substrate 102 is formed as a top insulating surface instead of a top conductive surface to avoid electrically shorting the TMD transistor 100.

The n-type 2D TMD layer 106 may be doped to n-type using aluminum as dopant. The TMD material of the n-type 2D TMD layer 106 may be a disulfide (such as $MoS_2$ or $WS_2$), a diselenide (such as $MoSe_2$ or $WSe_2$), or a ditelluride (such as $MoTe_2$ or $WTe_2$). Also, the n-type 2D TMD material 106 may have strong chemical bonding and electrical conduction within a plane of a single unit structure thickness (monolayer). The single unit structure has a transition metal atom and a chalcogenide atom above and below the transition metal atom. Electrical conduction perpendicular to the plane of the monolayer is typically poor and chemical bonding between monolayers is typically weak. In some embodiments, the structure thickness for the n-type 2D TMD layer 106 may be a monolayer, bilayer (2 monolayers), or trilayer (3 monolayers).

For example, $MoS_2$ or $WS_2$ may be used as the TMD material in n-type 2D TMD layer 106. A monolayer of $MoS_2$ may be approximately 6.5 Å thick. A monolayer of $WS_2$ may be approximately 7 Å thick.

The metal source electrode 108 and the metal drain electrode 110 may have lower electrical resistance as compared to doped semiconductor source and drain electrodes typically used for silicon-based microelectronics. The metal(s) for the metal source electrode 108 and the metal drain electrode 110 are selected to form a low resistance ohmic contact to the semiconductor material of the n-type 2D TMD layer 106 (instead of high resistance Schottky contacts that would effectively result in a non-functional transistor). For example, metals such as Sc, Ni, or a combination of Sc and Ni, may be selected as the source/drain electrodes to form the low resistance ohmic contact.

Gate dielectric 112 has a thickness selected to be sufficiently thin for allowing capacitive coupling of the metal gate electrode 114 to the n-type 2D TMD layer 106, while being sufficiently thick for low leakage between the metal gate electrode 114 and the n-type 2D TMD layer 106. The material for gate dielectric 112 may be aluminum oxide, hafnium oxide, zirconium oxide, tantalum oxide, silicon oxide, silicon oxynitride, or any combination thereof. The total thickness of gate dielectric 112 may depend upon the gate voltage applied on the metal gate electrode 114—a higher gate voltage requires a thicker gate dielectric 112. The metal gate electrode 114 may contain materials such as Ni, Ti, or a combination of Ni and Ti.

Figure 2:
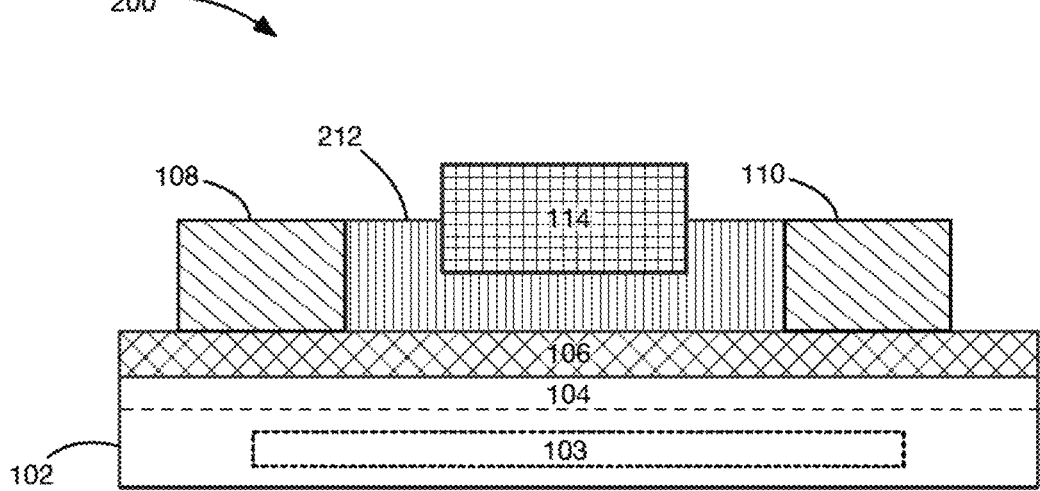
FIG. 2 illustrates a cross-sectional diagram of a TMD transistor according to another embodiment, wherein the shape of gate dielectric structure differs from that in FIG. 1.

FIG. 2 illustrates a TMD transistor 200 that is the same as the transistor 100 except the gate dielectric 112 is replaced with a gate dielectric 212, which is now shown extending over the region of the n-type 2D TMD layer 106 between the metal source electrode 108 and the metal drain electrode 110, and along the sidewalls of the metal source electrode 108 and the metal drain electrode 110. Gate dielectric 212 may further passivate the top surface of the n-type 2D TMD layer 106 and minimize damage to the n-type 2D TMD layer 106 during fabrication steps such as etch. While FIG. 2 illustrates an embodiment with the gate dielectric 212 flush with the top of the metal source electrode 108 and metal drain electrode 110, other embodiments may have the upper surface of the gate dielectric 212 above or below the top of metal source/drain electrodes 108/110. In still other embodiments the gate dielectric 212 may extend partially over the metal source/drain electrodes 108/110.

Figure 3:
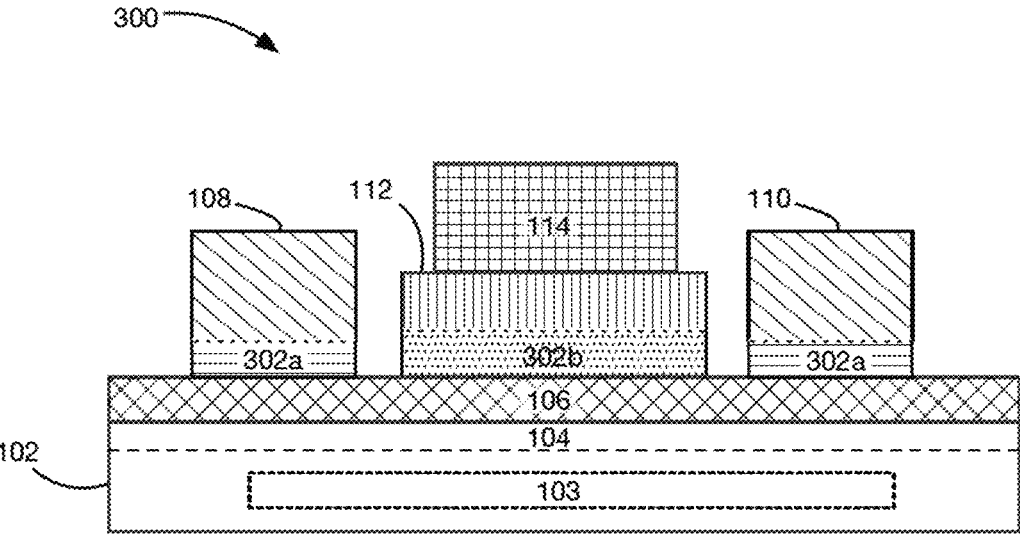
FIG. 3 illustrates a cross-sectional diagram of a TMD transistor according to yet another embodiment, wherein the metal source electrode, the metal drain electrode, and the gate dielectric differ from that in FIG. 1.

FIG. 3 illustrates a TMD transistor 300 that is the same as the TMD transistor 100 except that a thin layer of aluminum 302a is on the bottom of the metal source electrode 108 and the metal drain electrode 110, according to one embodiment. The thin layer of aluminum 302a is from excess aluminum beyond that used for doping of the n-type 2D TMD layer 106 which may remain, and thus becomes part of the metal source electrode 108 and the metal drain electrode 110. The TMD transistor 300 also includes a layer of aluminum oxide 302b at the bottom the gate dielectric 112, and in direct contact with the n-type 2D TMD layer 106. This aluminum oxide may form from excess aluminum beyond that used for doping of the n-type 2D TMD layer 106 that is subsequently oxidized. This layer of aluminum oxide 302b forms the lower portion of overall gate dielectric 112. For example, the aluminum oxide 302b may have a thickness in the range of 0.5 nm to 5 nm.

The TMD transistor structures of FIGS. 2 and 3 are not intended to be limiting embodiments. For example, the metal source electrode 108 and metal drain electrode 110 of FIG. 2 need not be homogenous structures, but may alternatively be a composite structure with a lower portion comprising an aluminum layer 302a, as depicted in FIG. 3. Similarly, the gate dielectric 212 of FIG. 2 need not be homogenous, but may alternatively be a composite structure with a lower portion comprising an aluminum oxide layer 302b, as depicted in FIG. 3.

FIG. 4 illustrates a method 400 of forming a TMD transistor according to one embodiment. Step 402 provides a substrate having an insulating layer and forms an un-doped 2D TMD layer on the insulating layer. The substrate may be substrate 102 of FIGS. 1 to 3. Step 404 deposits aluminum on the un-doped 2D TMD layer to transform the un-doped 2D TMD layer to an n-type 2D TMD layer, such as the n-type 2D TMD layer 106 of FIGS. 1 to 3. Step 406 forms a metal source electrode and a metal drain electrode on the n-type 2D TMD layer, such as the metal source electrode 108 and the metal drain electrode 110 of FIGS. 1 to 3. Step 408 forms a gate dielectric on the n-type 2D TMD layer. The gate dielectric may be the gate dielectric 112 of FIGS. 1 and 3 or the gate dielectric 212 of FIG. 2. Step 410 forms a metal gate electrode on the gate dielectric, and between the metal source electrode and the metal drain electrode. The metal gate electrode may be the metal gate electrode 114 of FIGS. 1 to 3.

FIGS. 5A to 5H illustrate cross-sectional views from intermediate stages 502 to 510 corresponding to steps 402 to 410 of FIG. 4 for fabricating the TMD transistor 300 of FIG. 3, according to one embodiment.

In FIG. 5A, intermediate stage 502 provides the substrate 102 having an electrically insulating top surface 104, and forms an undoped 2D TMD layer 105 on the insulating top surface 104. The undoped 2D TMD layer 105 may be formed directly on the substrate 102 by a Chemical Vapor Deposition (CVD) process or fabricated on a donor wafer, and then subsequently transferred to substrate 102. The undoped 2D TMD layer 105 may then be patterned using techniques such as photolithography and etch. Alternatively, the undoped 2D TMD layer 105 may be transferred and placed directly on the substrate 102 and with suitable dimensions such that subsequent patterning of the undoped 2D TMD layer 105 is not required.

In FIG. 5B, intermediate stage 504 deposits a thin layer of aluminum 302 as a dopant on the un-doped 2D TMD layer 105 of FIG. 5A to transform the undoped 2D TMD layer 105 into the n-type 2D TMD layer 106. The thin layer of aluminum 302 may have a thickness in the range of 0.5 to 4 nm, and serves as an n-type dopant in the n-type 2D TMD layer 106 such that electrons are available for electrical conductions. In one embodiment, the thin layer of aluminum 302 may be approximately 2 nm thick. As is standard in the industry, the term "n-type" indicates that electrons, which have a negative charge, is the predominant charge carrier for electrical conduction in the n-type 2D TMD layer 106. In some embodiments, electron beam evaporation and physical vapor deposition (sputtering) may be used to deposit the thin layer of aluminum 302.

Figure 5C:
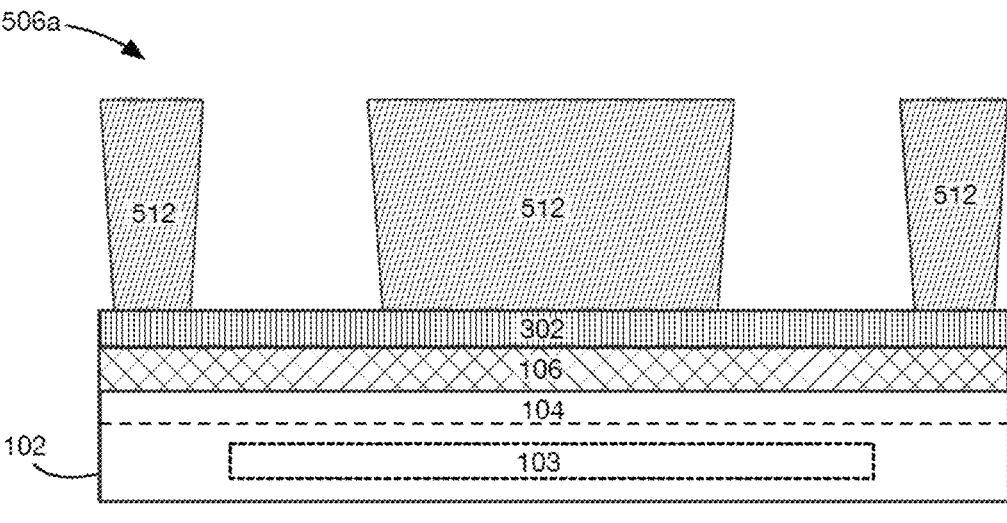
Figure 5D:
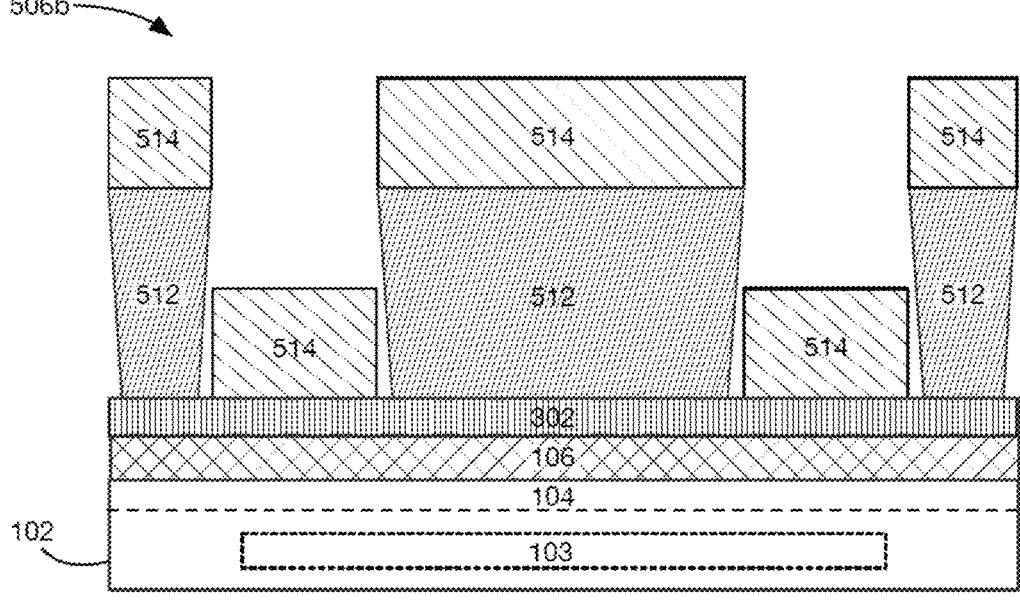
Figure 5E:
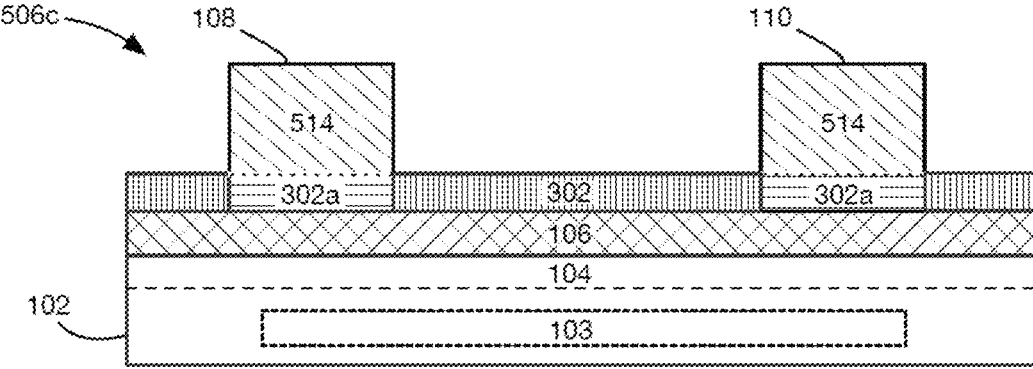

Referring to FIGS. 5C to 5E, intermediate stages 506a to 506c use a photoresist liftoff process to form the metal source electrode 108 and the metal drain electrode 110 above the n-type TMD layer 106.

In FIG. 5C, step 506a forms a layer of photoresist 512 patterned as a mask with a negative tone that determines locations of the metal source electrode 108 and the metal drain electrode 110. The structure of the photoresist 512 may have re-entrant sidewalls to aid in the liftoff process.

In FIG. 5D, intermediate stage 506b deposits a source/drain metal 514 on top of the patterned photoresist layer 512 and the thin layer of aluminum 302 above the n-type TMD layer 106. The deposition is preferably anisotropic, with deposition on top of structures and little to none on the sidewalls of the patterned photoresist layer 512. The use of re-entrant profiles for patterned photoresist layer 512 helps to minimize such sidewall deposition. Deposition methods such as electron beam evaporation and physical vapor deposition (sputtering) may be used. Metals such as Sc or Ni, or a combination thereof may be used for deposition of the source/drain metal 514.

In FIG. 5E, intermediate stage 506c shows a schematic cross section after the patterned photoresist layer 512 is dissolved away, typically using an organic solvent The portion of the source/drain metal 514 that had been deposited on photoresist layer 512 is effectively "lifted off" and rinsed away. The remaining source/drain metal 514 structures, in combination with the aluminum layer portions 302a immediately beneath them now comprise the metal source electrode 108 and the metal drain electrode 110 above the n-type TMD layer 106.

Other methods well known in the art besides liftoff may also be used to pattern the source/drain metal 514, such as metal deposition, followed by photolithography, patterned metal etch, and then strip of the photoresist layer.

A rapid thermal anneal at approximately 500° C. or cooler may be needed to convert the electrical contacts from the metal source/drain electrodes 108/110 to the n-type TMD layer 106 from Schottky (undesired) to ohmic (desired). This rapid thermal anneal is within a 500° C. thermal budget limit required to be compatible with electrical devices and BEOL metal lines that may be part of the substrate 102, according to one embodiment.

Figure 5F:
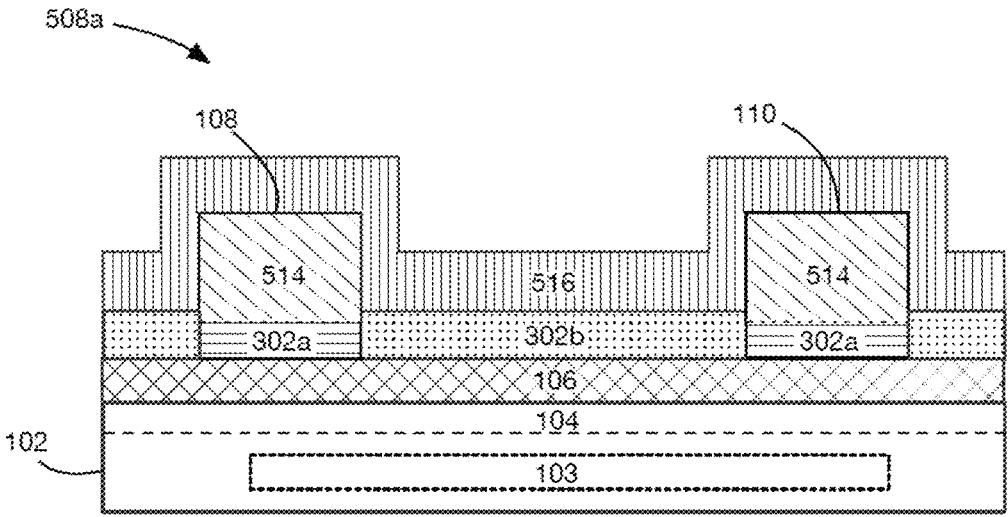
Figure 5G:
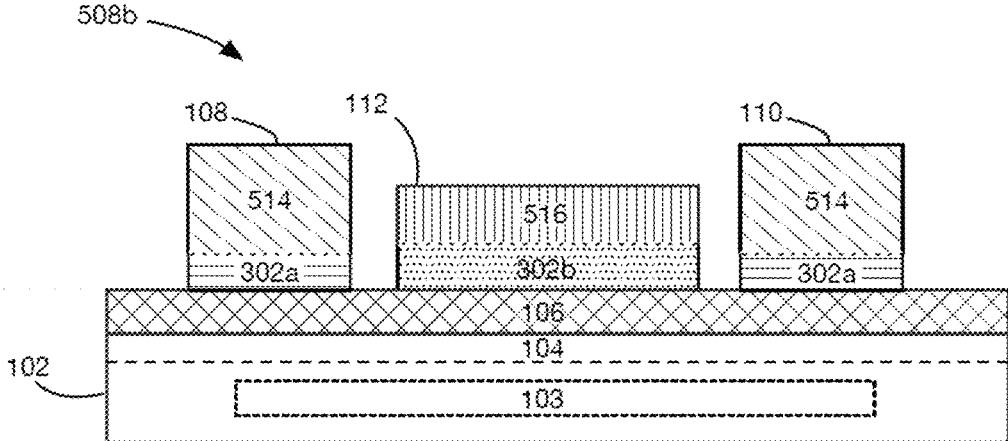

Referring to FIGS. 5F and 5G, intermediate stages 508a and 508b form the metal source electrode 108, the metal drain electrode 110, and the gate dielectric 112 above the n-type 2D TMD layer 106.

In FIG. 5F, intermediate stage 508a shows a deposited gate dielectric material 516 on the source/drain metals 514 and the thin layer of aluminum 302 (shown in FIG. 5E). The deposition process may oxidize any exposed part of the aluminum 302 not covered by the source/drain metals 514 to form an aluminum oxide 302b shown in FIG. 5F. The part of aluminum 302 covered by the source/drain metals 514 is not oxidized and is shown as a thin layer of aluminum 302a in FIG. 5F.

The deposited gate dielectric material 516 may include aluminum oxide, hafnium oxide, zirconium oxide, tantalum oxide, silicon oxide, or silicon oxynitride, or any combination thereof. Also, the deposited gate dielectric material 516 may be deposited using well known methods such as CVD or Atomic Layer Deposition (ALD). These types of depositions typically have oxidizing conditions to form high quality aluminum oxide 302b from the deposited aluminum layer 302. If the deposition conditions are insufficient to form a high quality aluminum oxide, a separate aluminum oxidation step may be performed prior to the deposition of gate dielectric material 516.

In FIG. 5G, intermediate stage 508b shows the structure after a patterned etch removes unwanted portions of the deposited gas dielectric material 516 and the aluminum oxide 302b. In this embodiment, the gate dielectric 112 has a lower portion of the aluminum oxide 302b and an upper portion of deposited gate dielectric material 516.

The interfaces between the aluminum 302a and the source/drain metal 514 may not be sharp. Diffusion and/or reactions of aluminum and the deposited metals may take place, depending upon the actual metals and the thermal history. The thin layer of aluminum 302a may have thickness approximately 3 nm or less to ensure that all excess aluminum under the deposited gate dielectric 516 may be fully oxidized to high quality aluminum oxide 302.

Figure 5H:
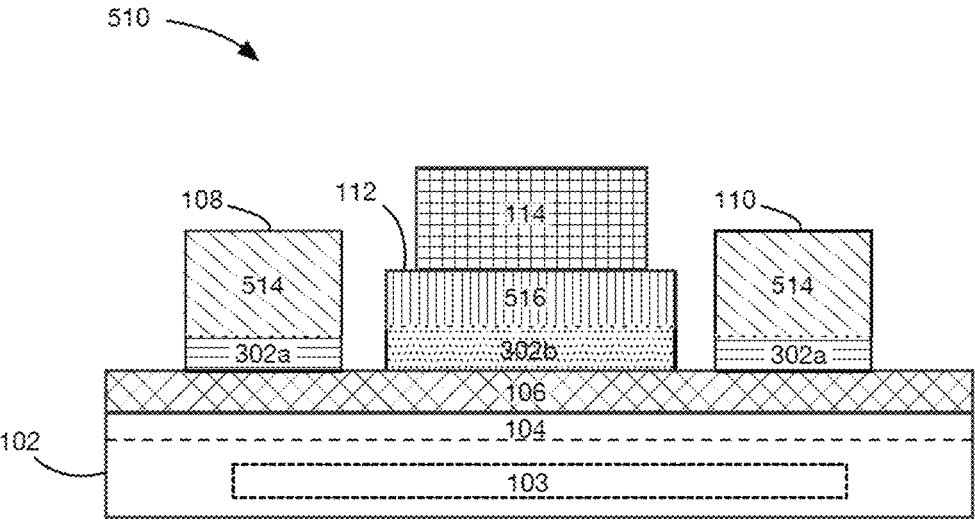

In FIG. 5H, intermediate stage 510 forms a metal gate electrode 114 above the gate dielectric 112 and between the metal source electrode 108 and the metal drain electrode

110. The metal gate electrode 114 may be formed using a liftoff process, similar to the liftoff process illustrated in FIGS. 5C to 5E. Alternatively, the metal gate electrode 114 may be formed using methods of metal deposition, photolithography, and etch that are well known in the art. In still another method, the metal gate electrode material may be deposited on the deposited gate dielectric material 516 prior to patterned etch of the deposited gate dielectric material 516. Then using a single patterning step, the unwanted portions of metal gate electrode material are etched to form a metal gate electrode 114, followed by etch of the unwanted portions of deposited gate dielectric material 516 and aluminum oxide 302b to form the gate dielectric 112. This provides self-alignment of the metal gate electrode 114 to the gate dielectric material 516. Ni or Ti, or a combination thereof may be used as the metal gate electrode 114. The metal gate material is selected based on desired threshold voltage and performance characteristics of the fabricated TMD transistor.

Figures 6A, 6B, 6C:
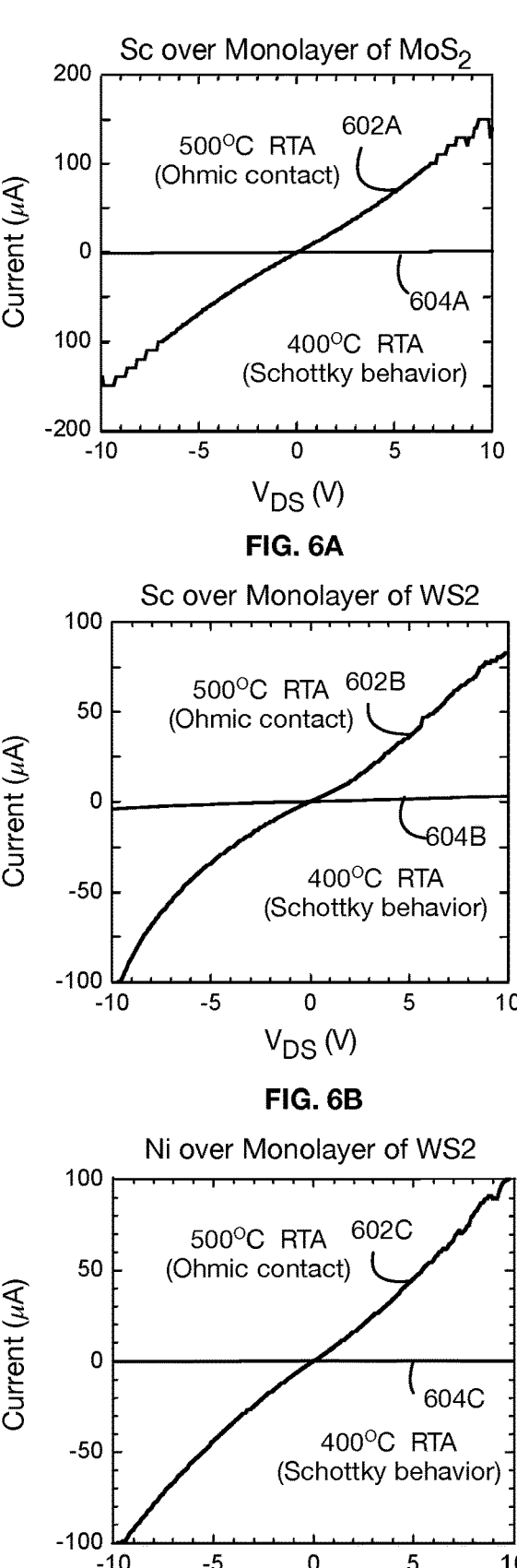
FIGS. 6A to 6C are diagrams illustrating I-V curves measured from a set of transmission line models according to embodiments for scandium electrodes over a monolayer of $MoS_2$, scandium electrodes over a monolayer of $WS_2$, and nickel electrodes over a monolayer of $WS_2$.

FIGS. 6A to 6C are diagrams illustrating I-V curves measured from a set of transmission line models according to embodiments for scandium electrodes over a monolayer of $MoS_2$ (FIG. 6A), scandium electrodes over a monolayer of $WS_2$ (FIG. 6B), and nickel electrodes over a monolayer of $WS_2$ (FIG. 6C). The I-V curves in FIGS. 6A to 6C illustrate formation of ohmic contacts shown at 602A, 602B, and 602C with a rapid thermal annealing (RTA) process at 500° C. (and Schottky behavior shown at 604A, 604B, and 604C with RTA at 400° C.) for Sc fabricated over the monolayer of $MoS_2$ and over the monolayer of $WS_2$ and for Ni over the monolayer of $WS_2$.

What is claimed is:

1. A transition metal dichalcogenide (TMD) transistor, comprising:

a substrate comprising a semiconductor material and having a top portion that is an insulating layer;

an n-type two-dimensional (2D) TMD layer on the insulating layer, the n-type 2D TMD layer having a first side adjacent to the substrate and a second side opposite the first side;

a metal source electrode, a metal drain electrode, and a gate dielectric on the second side of the n-type 2D TMD layer; and a metal gate electrode on top of the gate dielectric, wherein the metal gate electrode is between the metal source electrode and the metal drain electrode; wherein the substrate comprises an electrical device in the semiconductor material within the substrate.

2. The TMD transistor according to claim 1 wherein the electrical device comprises a resistor, a capacitor, an inductor, a diode, a transistor, or a combination thereof.

3. The TMD transistor according to claim 1 wherein the n-type 2D TMD layer comprises $MoS_2$ or $WS_2$.

4. The TMD transistor according to claim 1 wherein the n-type 2D TMD layer has a thickness in the range of 1 to 3 monolayers.

5. The TMD transistor according to claim 1 wherein the n-type 2D TMD layer is doped with aluminum.

6. The TMD transistor according to claim 1 wherein the metal source electrode and the metal drain electrode each comprise Sc or Ni, or a combination thereof.

7. The TMD transistor according to claim 1 wherein a lower portion of the metal source electrode and of the metal drain electrode comprises aluminum.

8. The TMD transistor according to claim 1 wherein the gate dielectric comprises an insulator selected from the group consisting of aluminum oxide, hafnium oxide, zirconium oxide, tantalum oxide, silicon oxide, silicon oxynitride, and any combination thereof.

9. The TMD transistor according to claim 1 wherein the gate dielectric comprises aluminum oxide, and the aluminum oxide is in contact with the n-type 2D TMD layer.

10. The TMD transistor according to claim 1 wherein the gate dielectric extends over a region of the n-type 2D TMD layer between the metal source electrode and the metal drain electrode and along sidewalls of the metal source electrode and the metal drain electrode.

11. The TMD transistor according to claim 1 wherein the metal gate electrode contains Ni, Ti, or a combination of Ni and Ti.

12. The TMD transistor according to claim 1 wherein a lower portion of the metal source electrode and of the metal drain electrode comprises aluminum.

13. A method for forming a transition metal dichalcogenide (TMD) transistor comprising:

providing a substrate comprising a semiconductor material and having a top layer that is insulating;

forming a two-dimensional (2D) TMD layer on the substrate, the n-type 2D TMD layer having a first side adjacent to the substrate and a second side opposite the first side;

forming a metal source electrode and a metal drain electrode on the second side of the 2D TMD layer;

forming a gate dielectric on the second side of the 2D TMD layer; and forming a metal gate electrode on the gate dielectric, wherein the metal gate electrode is between the metal source electrode and the metal drain electrode; wherein the substrate comprises an electrical device in the semiconductor material within the substrate.

14. The method according to claim 13 wherein the electrical device comprises a resistor, a capacitor, an inductor, a diode, a transistor, or a combination thereof.

15. The method according to claim 13 wherein the 2D TMD layer comprises $MoS_2$ or $WS_2$.

16. The method according to claim 13 wherein the 2D TMD layer has a thickness in the range of 1 to 3 monolayers.

17. The method according to claim 13 wherein the metal source electrode and the metal drain electrode each comprise Sc or Ni, or a combination thereof.

* * * * *